US007443748B2

(12) United States Patent
Aoki

(10) Patent No.: US 7,443,748 B2
(45) Date of Patent: Oct. 28, 2008

(54) SEMICONDUCTOR MEMORY DEVICE AND METHOD OF TESTING THE SAME

(75) Inventor: Mamoru Aoki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/616,452

(22) Filed: Dec. 27, 2006

(65) Prior Publication Data

US 2007/0159900 A1 Jul. 12, 2007

(30) Foreign Application Priority Data

Jan. 11, 2006 (JP) ............................ 2006-003671

(51) Int. Cl.
*G11C 7/00* (2006.01)

(52) U.S. Cl. ...................................... 365/203; 365/201

(58) Field of Classification Search ....................... None
See application file for complete search history.

(56) References Cited

U.S. PATENT DOCUMENTS 4,817,057 A * 3/1989 Kondo et al. ................ 365/203
5,029,142 A * 7/1991 Ando ...................... 365/233.5
5,313,434 A * 5/1994 Abe ........................ 365/233.5
5,815,451 A * 9/1998 Tsuchida .................... 365/203
6,104,651 A * 8/2000 Cowles et al. ............... 365/201
6,185,137 B1 * 2/2001 Sato et al. .................. 365/200
6,862,234 B2 * 3/2005 Versen et al. .............. 365/201
7,006,396 B2 * 2/2006 Kodama ..................... 365/203
7,102,947 B2 * 9/2006 Kajitani et al. ............. 365/205
7,193,921 B2 * 3/2007 Choi et al. .................. 365/229

* cited by examiner

*Primary Examiner*—Tan T. Nguyen
(74) *Attorney, Agent, or Firm*—Whitham Curtis Christofferson & Cook, PC

(57) ABSTRACT

Disclosed is a semiconductor memory device includes two equalizing elements, each connected between a pair of bit lines and being separately subjected to on/off control by respective control signals. When performing a test, one of the control signals is kept HIGH and the other of the control signal is kept LOW during a precharge period, and activation/deactivation of the two equalizing elements is separately controlled. A failure such as a defect in one of the two equalizing elements subjected to the on/off control by the control signal can be thereby detected.

17 Claims, 5 Drawing Sheets

SEMICONDUCTOR MEMORY DEVICE AND METHOD OF TESTING THE SAME

FIELD OF THE INVENTION

The present invention relates to a semiconductor memory device. More specifically, the invention relates to a dynamic random access memory (DRAM) and a method of testing the DRAM.

BACKGROUND OF THE INVENTION

As a background of the invention, a configuration of a DRAM including equalizers on far-end and near-end sides of bit lines, respectively, as seen from a sense amplifier, will be described with reference to FIG. 1 which is referred to in a description about the present invention as well. FIG. 1 is a diagram showing a general configuration of the sense amplifier that amplifies memory cell data in the DRAM.

Referring to FIG. 1, signals DT and DB are the signals on one and the other of a bit line pair. Reference characters SAP and SAN denote control signals for activating and deactivating a sense amplifier 20. Reference characters PDLF and PDLN denote control signals for performing on/off control of equalizers (equalizing elements) N3 and N4, respectively, which equalize the bit lines DT and DB. Reference characters WL1 and WL2 denote word lines. A memory cell in a memory array 10 includes a capacitor (memory capacitor) that stores data and a memory cell transistor that has a gate connected to a corresponding word line, has one of a drain and a source connected to a corresponding bit line, and has the other of the drain and the source connected to the capacitor. The equalizing elements N3 and N4 are connected between bit line pair DT and DB. Gates of the equalizing elements N3 and N4 are connected to the control signals PDLF and PDLN, respectively. When the equalizing elements N3 and N4 are turned on, the equalizing elements N3 and N4 equalize electric potentials of the bit line pair DT and DB. The sense amplifier 20 includes PMOS transistors P1 and P2 which have sources connected in common to the control signal SAP and NMOS transistors N1 and N2 which have drains connected to drains of the PMOS transistors P1 and P2, respectively. Gates of the PMOS transistor P1 and the NMOS transistor N1 are connected in common to a common connecting node between the drains of the PMOS transistors P1 and P2. Gates of the PMOS transistor P2 and the NMOS transistor N2 are connected in common to a common connecting node between the drains of the PMOS transistor P1 and the NMOS transistor N1. A common connecting node between the drains of the PMOS transistor P2 and the NMOS transistor N2 is connected to the bit line DT, while a common connecting node between the drains of the PMOS transistor P1 and the NMOS transistor N1 is connected to the bit line DB. The PMOS transistor P1 and the NMOS transistor N1 constitute a first CMOS inverter, while the PMOS transistor P2 and the NMOS transistor N2 constitute a second CMOS inverter. An output of the first CMOS inverter is connected to an input of the second CMOS inverter and an input of the second CMOS inverter is connected to an input of the first CMOS inverter, thereby forming a latch circuit (flip-flop).

Next, an operation of FIG. 1 will be described with reference to a timing chart in FIG. 4. In FIG. 4, (A) shows a waveform of a clock and command, (B) shows waveforms of the control signals PDLN and PDLF, (C) shows waveforms of word lines 1 and 2, (D) shows waveforms of the bit lines DT and DB at a time of a normal operation, and (E) shows waveforms of the bit lines DT and DB when a defect is present in one of the equalizing elements. A description will be given below about a case where an active command (ACT) and a precharge command (PRE) are been input in the order of ACT, PRE, and ACT. Though a READ/WRITE command is input between the ACT command and the next PRE command, illustration of the READ/WRITE command is not performed in FIG. 4 for simplicity of the description. The same holds true in FIGS. 5 through 9.

Before the first ACT is input, the DRAM is in a precharged state. In the precharged state, all word lines are kept LOW, the control signals PDLF and PDLN are kept HIGH, the NMOS transistors N3 and N4 are kept on, and the bit lines DT and DB are in an equalized state. During a precharge period, the power supply to the control signals SAP and SAN is stopped (and the control signals SAP and SAN are at an intermediate level between High and Low levels). The sense amplifier 20 is deactivated, and an output of the sense amplifier is in an off state (floating state) and has the same potential as the bit lines.

In the following description, it is assumed that an external address associated with the word line I is input when the first-time ACT command has been input (that is, when the ACT command has been input, a ROW address is input from an address signal terminal not shown). When the ACT command is received, the control signals PDLF and PDLN are switched from HIGH to LOW in order to cancel the equalization of the bit lines.

Then, the selected word line (WL1) is activated and set to a HIGH level. Then, memory cell transistors with gates thereof connected to the selected word line 1 (WL1) are turned on. Due to electric charge in the memory cell capacitor, a minute difference potential is generated between the bit line DT and the bit line DB to which a memory cell transistor in an on state is connected. Then, the control signal SAP is set to HIGH, and the control signal SAN is set to LOW to activate the sense amplifier 20. Amplification of the minute difference potential between the bit lines DT and DB by the sense amplifier 20 is started.

Then, when the amplification of the voltage between the bit lines DT and DB by the sense amplifier 20 is continued, the potentials of the bit lines DB and DT get to SAP and SAN levels, respectively.

Next, when the PRE command is received, the selected word line 1 (WL1) is first brought into a deactivated state (LOW level) from an activated state (HIGH level), and the memory cell transistor is turned off. After the word line (WL1) has been driven LOW, the control signals SAP and SAN are electrically disconnected from the power supply. The sense amplifier 20 is thereby deactivated. The control signals PDLF and PDLN are switched from LOW to HIGH. The equalizing element N3 and N4 are turned on, thereby starting equalization of the pair of the bit lines DT and DB.

An equalizing time of the pair of the bit lines DT and DB determines basic performance of the DRAM such as tRP (time from issuing of the precharge command to issuing of the subsequent active command). For this reason, when a bit line length is long, an approach is sometimes employed in which the equalizing elements N3and N4 are installed on the far-end and near-end sides of the bit lines, respectively, as shown in FIG. 1, thereby reducing the time tRP.

SUMMARY OF THE DISCLOSURE

In a semiconductor memory device described with reference to FIGS. 1 and 4, when some defect is generated in one of the equalizing elements N3 and N4, and then when the one of the equalizing elements N3 and N4 is turned off, becomes high resistance, or the like, the equalization is performed only by the other of the equalizing elements N3 and N4 (as shown (E) of FIG. 4). When there is only one equalizing element in a semiconductor memory device and then when the equalizing element fails, the equalization is greatly delayed. Thus, the defect can be detected in a step of inspecting the semiconductor memory device.

However, assume that there are two equalizing elements such as the equalizing elements N3 and N4, which are connected to the same bit lines as in the configuration shown in FIG. 1. Then, even if one of these two equalizing elements has a defect, the other of the two equalizing elements will perform an operation of equalizing the bit lines.

As a result, even if there is a defect in the equalizing element, deterioration of the time tRP will be reduced. Then, a failure caused by the defective equalization may not be able to be detected in an inspection step using a low-speed tester that has a limit in terms of a tRP set value.

The present invention has been devised based on the above described knowledge of the present inventor. An object of the present invention is therefore to provide a semiconductor memory device that can detect a failure in an equalizing element in an inspection step even if there are a plurality of equalizing elements connected to the same bit lines, and a method of testing the semiconductor memory device.

In order to solve the problem described before, the invention disclosed in this application is schematically configured as follows.

A semiconductor memory device according to one aspect of the present invention includes: a plurality of equalizing elements, each connected between a pair of bit lines for equalizing said pair of bit lines; and a control circuit that performs activation/deactivation control of said plurality of equalizing elements separately, when equalizing said pair of bit lines.

The present invention may include: first and second equalizing elements disposed on near-end and far-end sides of the bit lines connected to a sense amplifier, respectively. The first and second equalizing elements are separately subjected to activation/deactivation control thereof during a precharge period.

In the present invention, a sense amplifier may be shared by first and second memory cell arrays arranged opposed to each other with the sense amplifier interposed therebetween. A pair of bit lines on a side of said first memory cell array are connected to a pair of bit lines on a side of said sense amplifier via first transfer gates and a pair of bit lines on a side of said second memory cell array are connected to said pair of bit lines on a side of said sense amplifier via second transfer gates. The plurality of equalizing elements include: a first equalizing element that equalizes said pair of bit lines on the side of said first memory cell array; and a second equalizing element that equalizes said pair of bit lines on the side of said second memory cell array. The first and second equalizing elements separately are subjected to activation/deactivation control during a precharge period. In the present invention, when performing a test, control is performed so that one of the first and second equalizing elements is activated and the other of the first and second equalizing elements is deactivated.

In the present invention, a sense amplifier may be shared by first and second memory cell arrays arranged opposed to each other with the sense amplifier interposed therebetween. A pair of bit lines on a side of said first memory cell array are connected to a pair of bit lines of said sense amplifier via first transfer gates; and a pair of bit lines on a side of said second memory cell array are connected to said pair of bit lines of said sense amplifier via second transfer gates. The plurality of equalizing elements include: a first equalizing element that equalizes said pair of bit lines on the side of said first memory cell array extended on a side of said sense amplifier; a second equalizing element that equalizes said pair of bit lines on the side of said first memory cell array extended on a side opposite to said sense amplifier; a third equalizing element that equalizes said pair of bit lines on the side of said second memory cell array extended on a side of said sense amplifier; and a fourth equalizing element that equalizes said pair of bit lines on the side of said second memory cell array extended on a side opposite to said sense amplifier. The first through fourth equalizing elements separately are subjected to activation/deactivation control during a precharge period.

A method according to another aspect of the present invention is the method of testing a semiconductor memory device with a plurality of equalizing elements connected between a pair of bit lines, comprising the steps of:

performing activation/deactivation control of said plurality of equalizing elements separately, when equalizing; and detecting a defective equalizing operation.

In the method according to the present invention, the semiconductor memory device includes: first and second equaling elements disposed on near-end and far-end sides of the bit lines connected to a sense amplifier, respectively. The activation/deactivation control of said first and second equalizing elements is separately performed during a precharge period.

In the method according to the present invention, a sense amplifier of the semiconductor memory device may be shared by first and second memory cell arrays arranged opposed to each other with the sense amplifier interposed therebetween. A pair of bit lines on a side of said first memory cell array are connected to a pair of bit lines on a side of said sense amplifier via first transfer gates and a pair of bit lines on a side of said second memory cell array are connected to said pair of bit lines on a side of said sense amplifier via second transfer gates. The plurality of equalizing elements include: a first equalizing element that equalizes said pair of bit lines on the side of said first memory cell array; and a second equalizing element that equalizes said pair of bit lines on the side of said second memory cell array. The first and second equalizing elements separately are subjected to activation/deactivation control during a precharge period. In the method according to the present invention, when performing a test, control is performed so that one of the first and second equalizing elements is activated and the other of the first and second equalizing elements is deactivated.

In the method according to the present invention, a sense amplifier of the semiconductor device is shared by first and second memory cell arrays arranged opposed to each other with the sense amplifier interposed therebetween. A pair of bit lines on a side of said first memory cell array are connected to a pair of bit lines of said sense amplifier via first transfer gates; and a pair of bit lines on a side of said second memory cell array are connected to said pair of bit lines of said sense amplifier via second transfer gates. The plurality of equalizing elements include: a first equalizing element that equalizes said pair of bit lines on the side of said first memory cell array extended on a side of said sense amplifier; a second equalizing element that equalizes said pair of bit lines on the side of said first memory cell array extended on a side opposite to said sense amplifier; a third equalizing element that equalizes said pair of bit lines on the side of said second memory cell array extended on a side of said sense amplifier; and a fourth equalizing element that equalizes said pair of bit lines on the side of said second memory cell array extended on a side opposite to said sense amplifier. In the method according to the present invention, the first through fourth equalizing elements separately are subjected to activation/deactivation control during a precharge period.

In the method according to the present invention, the activation/deactivation of said equalizing elements is performed under control of a test equipment, and a time tRP which is a time as from a command for precharging said pair of bit lines to a subsequent active command is tested.

The meritorious effects of the present invention are summarized as follows.

According to the present invention, on/off control is separately performed over a plurality of equalizing elements. When a defect is present in one of the equalizing elements, the defect can be thereby detected.

Still other features and advantages of the present invention will become readily apparent to those skilled in this art from the following detailed description in conjunction with the accompanying drawings wherein embodiments of the invention are shown and described, simply by way of illustration of the mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

DETAILED DESCRIPTION OF THE INVENTION

A description of the present invention will be given with reference to appended drawings. In a semiconductor memory device according to the present invention, two equalizing elements N3 and N4 are connected to the same pair of bit lines DT and DB and are on/off controlled by control signals PDLF and PDLN, respectively. In a precharge period, the control signal PDLN is set to HIGH and the control signal PDLF is set to LOW, for example, and activation and deactivation of the two equalizing elements are individually controlled. With this arrangement, a failure such as a defect in the equalizing element N4 that is subjected to the on/off control by the control signal PDLN can be detected. A description will be given below in connection with some specific examples.

A configuration and an operation of an example of the present invention will be described with reference to FIGS. 1, 4, and 5. A normal operation (shown in FIG. 4) will be described and then a test mode operation (shown in FIG. 5) will be described.

Figure 1:
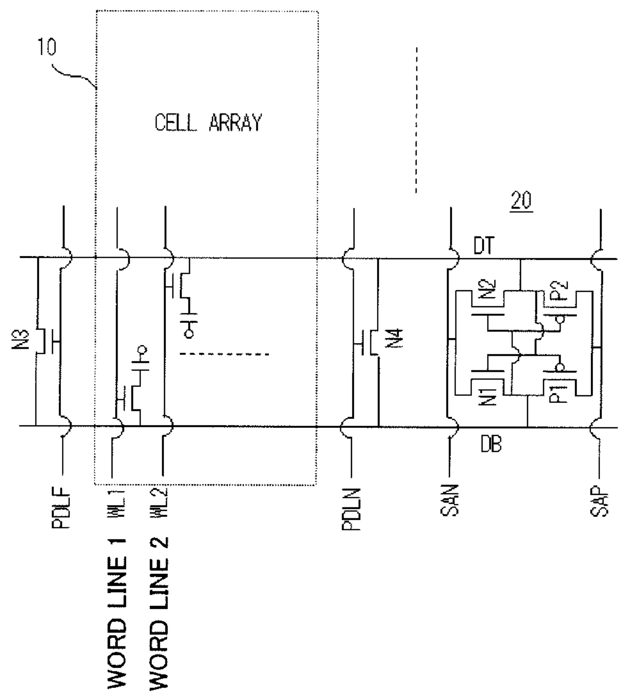
FIG. 1 is a diagram showing a configuration of a first example of the present invention.

FIG. 1 shows a configuration of a sense amplifier provided in a DRAM to which the present invention is applied. As described before, reference characters DT and DB denote the pair of bit lines, and reference characters WL1 and WL2 denote a word line 1 and a word line 2, respectively, reference characters PDLF and PDLN denote the signals which activate/deactivate the equalizing elements N3 and N4 that equalize the pair of the bit lines DT and DB. Reference characters SAP and SAN denote signals for activating/deactivating a sense amplifier 20. It is assumed below that HIGH electric charge is written into a memory cell.

As described above, FIG. 4 is a diagram showing timing waveforms at a time of the normal operation when control of the present invention is not performed. During a precharge standby period, the control signals PDLN and PDLF are HIGH, and the bit lines DT and DB are on standby, being equalized at a certain intermediate level. The signals SAP and SAN are also at the intermediate level, and the sense amplifier 20 is inactive. When a command (ACT) for accessing the word line 1 is input from outside, the signals PDLF and PDLN both go LOW from HIGH, and the equalization is cancelled. After cancellation of the equalization, the word line 1 goes HIGH from LOW, and the HIGH electric charge in a memory cell capacitor C are discharged to the bit line, thereby generating a difference between potentials of the bit lines DT and DB.

Thereafter, when the signal SAP is set to HIGH and the signal SAN is set to LOW, the sense amplifier 20 is activated. Then, due to an amplifying operation of the sense amplifier 20, the pair of the bit lines DB and DT is amplified to SAP and SAN levels, respectively.

Next, when a precharge command (PRE) is input, the selected word line 1 (WL1) is first driven LOW from HIGH, and the memory cell transistors connected to the selected word line 1 (WL1) are turned off.

Figure 4:
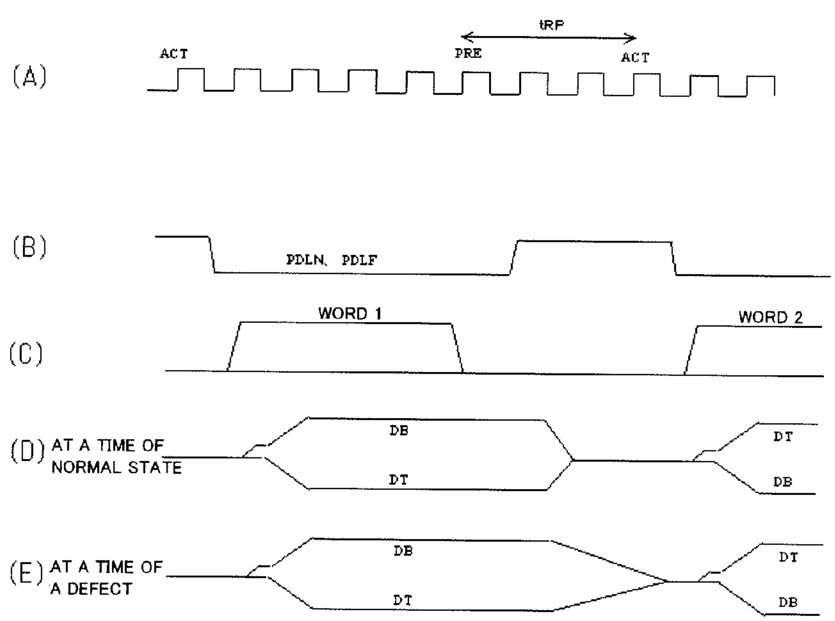
FIG. 4 includes diagrams for explaining an operation in FIG. 1.

Thereafter, the signals SAP and SAN are set to LOW and HIGH respectively, the sense amplifier 20 is deactivated, and the signals PDLN and PDLF are to HIGH, thereby equalizing the pair of the bit lines DT and DB (as shown (D) of FIG. 4).

An equalizing speed of the pair of the bit lines DT and DB is a specification that determines tRP (time taken from issuing of the precharge command to issuing of a subsequent active command), which is basic performance of the DRAM. As described before, in an example in FIG. 1, the equalizing elements N3 and N4 are installed on far-end and near-end sides of the bit lines, respectively, thereby more reducing the time tRP.

If the equalizing element N4 to which the signal PDLN is connected has a nonconductive or highly-resistant defect, equalization of the pair of the bit lines DT and DB is delayed, as described before (as shown (E) of FIG. 4).

Next, the test mode operation in this example will be described with reference to FIG. 5. Referring to FIG. 5, (A) shows a waveform of a clock (and commands), (B) shows waveforms of the signals PDLN and PDLF, (C) shows waveforms of the word lines 1 and 2, (D) shows waveforms of the pair of the bit lines DT and DB at a time of a normal state, and (E) shows waveforms of the pair of the bit lines DT and DB when one of the equalizing elements has a defect.

During the precharge standby period, the signal PDLN is HIGH, while the signal PDLF is LOW.

When the ACT command for accessing the word line 1 is input from outside, the signal PDLN goes LOW, and the signal PDLF remains low.

Then, the selected word line 1 is set from LOW to HIGH, and the HIGH electric charge in the memory cell capacitor is discharged to the bit line. A difference potential is thereby generated between the pair of the bit lines DT and DB.

Then, when the signal SAP is set to HIGH and the signal SAN is set to LOW to activate the sense amplifier 20, the pair of the bit lines DT and DB is amplified to the SAN and SAP levels, respectively, due to the amplifying operation of the sense amplifier 20.

Next, when the PRE command is input, the word line 1 goes LOW from HIGH. The memory cell transistor is thereby turned off.

Then, the signals SAP and SAN are turned off to deactivate the sense amplifier 20. The signal PDLN is set from LOW to HIGH, and the signal PDLF is kept LOW. For this reason, equalization of the bit lines is performed by only the equalizing element N4 connected to the signal PDLN, and the time tRP is increased. An equalizing operation, however, is performed (as shown (D) of FIG. 5).

Figure 5:
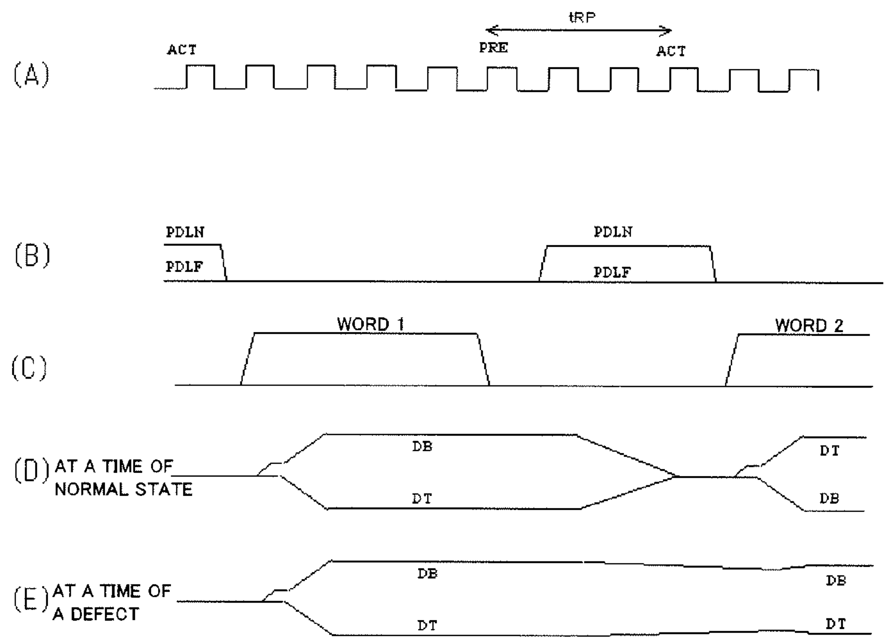
FIG. 5 includes diagrams for explaining a test mode operation in the first example of the present invention.

By including a function of controlling the equalizing elements individually by the signals PDLN and PDLF, the pair of the bit lines DT and DB will be scarcely equalized as shown (E) of FIG. 5 when the nonconductive or high resistance defect is present in the equalizing element N4 in FIG. 1, connected to the signal PDLN. Accordingly, even an inspecting device that cannot set the time tRP to be so small can readily detect the defect. When a defect in the equalizing element N3 connected to the signal PDLF is detected, respective operations of the signals PDLF and PDLN at a time of a test mode are reversed, thereby allowing detection of the defect in the equalizing element N3 connected to the signal PDLF.

The present invention controls a plurality of equalizers, which are usually set to be both active during the precharge period, to be separately activated or deactivated at a time of a test.

Figure 2:
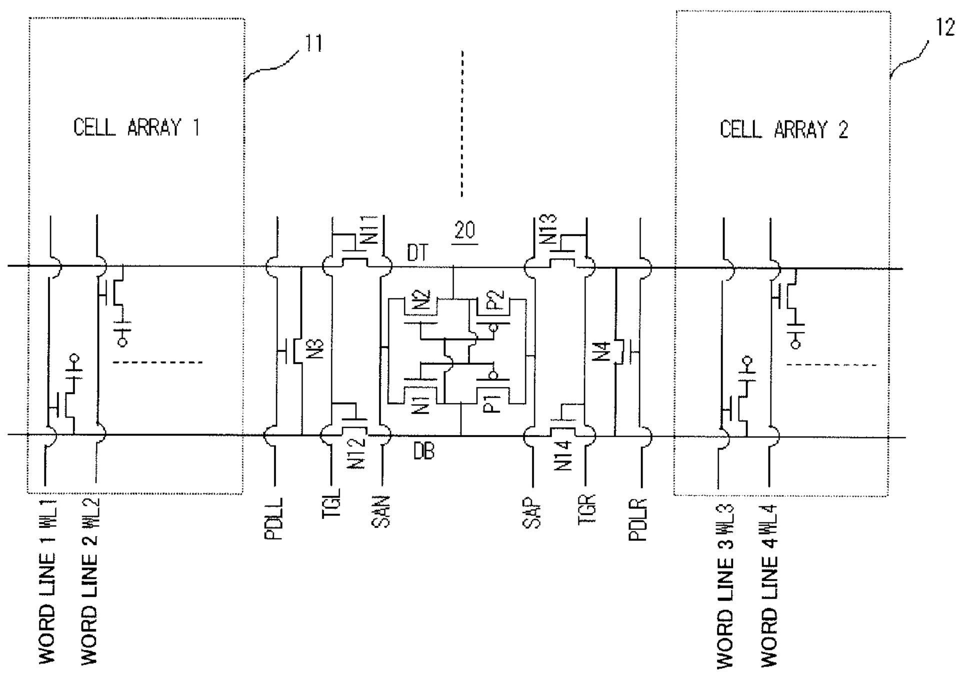
FIG. 2 is a diagram showing a configuration of a second example of the present invention.
Figure 6:
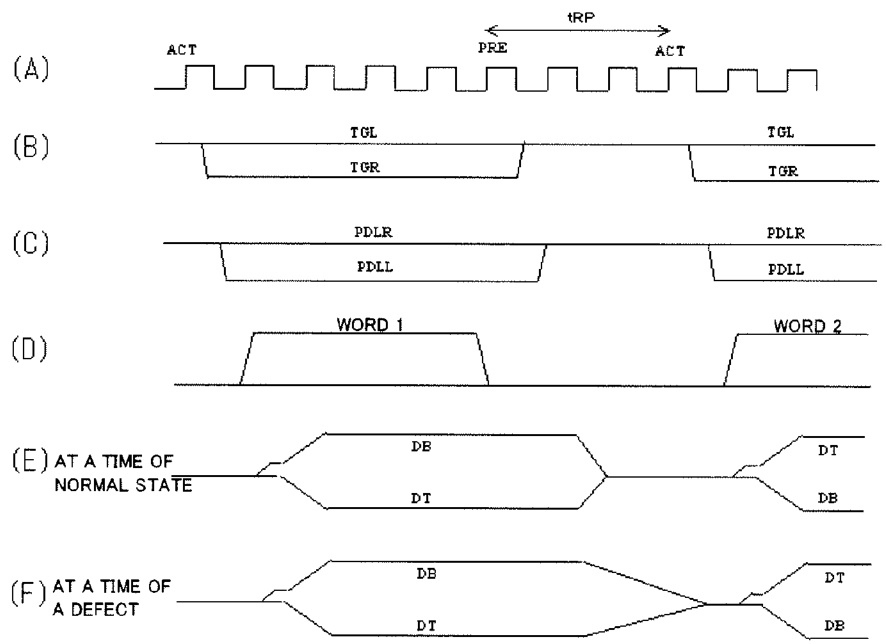
FIG. 6 includes diagrams for explaining an operation in FIG. 2.
Figure 7:
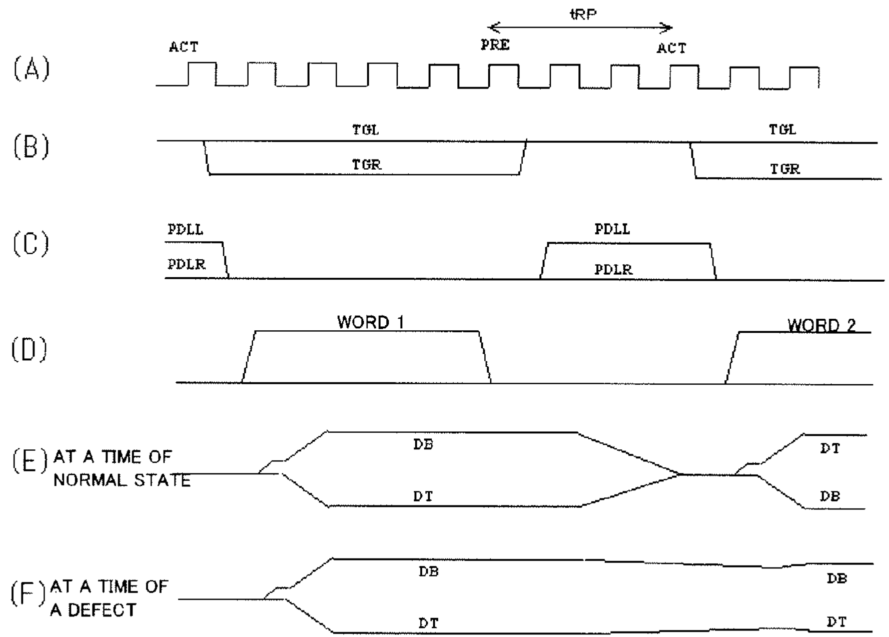
FIG. 7 includes diagrams for explaining a test mode operation in the second example of the present invention.

Next, a second example of the present invention will be described with reference to FIGS. 2, 6, and 7. FIG. 2 is a diagram showing a configuration of the second example of the present invention. FIG. 6 is a timing chart for explaining an operation of a shared sense amplifier in FIG. 2. FIG. 7 is a timing chart explaining a test mode operation in the second example of the present invention.

As shown in FIG. 2, the present invention can also be applied to the shared sense amplifier commonly used in the DRAM. Referring to FIG. 2, reference character TGL (for a memory cell array 11) and reference character TGR (for a memory cell array 12) denote signals each for opening or closing transfer gates of the shared sense amplifier. Transfer gates (NMOS transistors) N11 and N12 which have gates thereof connected to the signal TGL control conduction and non-conduction between the bit lines DT and DB connected to the sense amplifier 20 and bit lines on a side of the memory cell array 11. Transfer gates (NMOS transistors) N13 and N14 which have gates thereof connected to the signal line TGR control conduction and nonconduction between the bit lines DT and DB connected to the sense amplifier 20 and bit lines on a side of the memory cell array 12. The sense amplifier (constituted from PMOS transistors P1 and P2 and NMOS transistors N1 and N2) has the same configuration as the configuration in FIG. 1. Activation and deactivation of the sense amplifier is controlled by the signals SAP and SAN.

Reference character PDLL (for the memory cell array 11) denotes a signal for turning on or off the equalizing element N3 for the bit lines, and reference character PDLR (for the memory cell array 12) denotes a signal for turning on or off the equalizing element N4 for the bit lines.

FIG. 6 is a diagram showing an operation of the second example of the present invention. Referring to FIG. 6, (A) shows a waveform of a clock, (B) shows waveforms of the signals TGL and TGR, (C) shows waveforms of the signals PDLL and PDLR, (D) shows waveforms of the word lines 1 and 2, (E) shows the pair of the bit lines DT and DB at a time of a normal state, and (F) shows waveforms of the pair of the bit lines DT and DB when a defect is generated. A description will be given below when command input of the active command (ACT) and the precharge command (PRE) is performed in the order of ACT, PRE, and ACT, as an example of a commonly used synchronous DRAM.

Before the first ACT is input, the DRAM is in a precharged state. In the precharged state, word lines are all LOW, the signals PDLL and PDLR are HIGH, and the signals TGL and TGR are also HIGH. The bit lines DT and DB are in an equalized state. During the precharge period, the power supply to the signals SAP and SAN is stopped, and the outputs of the sense amplifier are precharged to the same potential as the bit lines.

Operations of the respective signals when the first ACT command is input will be described.

It is assumed that an external address associated with the word line 1 (word line WL1 within the memory cell array (a CELL ARRAY 1) on a left side of FIG. 2) is input at the time of the first ACT command.

When the ACT command is received, the signal TGR is switched from HIGH to LOW in order to interrupt a nonselected side of the shared sense amplifier (side where the selected word line is not present) (as shown (B) of FIG. 6).

In order to release the equalization of the bit lines on a selected side of the shared sense amplifier, the signal PDLL is switched from HIGH to LOW. The equalizing element N4 is turned off.

Then, the selected word line 1 (WL1) is switched from LOW to HIGH, and the memory cell transistors connected to the word line 1 (WL1) are turned on. A minute difference potential is generated between the pair of the bit lines DT and DB due to electric charge in the memory cell capacitor.

Then, the signal SAP is switched to HIGH, and the signal SAN is switched to LOW, thereby activating the sense amplifier 20. Amplification of the minute difference potential between the pair of the bit lines DT and DB is then started. When the amplification by the sense amplifier 20 is continued, the bit lines DT and DB attain the SAN and SAP levels, respectively.

When the PRE command is received thereafter, the selected word line 1 (WL1) is first switched from HIGH to LOW, and the memory cell transistors are thereby turned off. After the selected word line has been driven LOW, power supply for the signals SAP and SAN are stopped, the signal PDLL is switched from LOW to HIGH, and the equalization of the bit lines is started. At this point, the signal TGR is switched from LOW to HIGH almost simultaneously.

In a method using the shared sense amplifier, there is an advantage that the equalizing element on the nonselected side also performs an equalizing operation. However, when a nonconductive equalizing element is present due to some reason caused by a manufacturing process or the like, the time tRP increases in a portion that uses the defective equalizing element, and the DRAM may not satisfy a tRP specification. As described before, such a defect should be detected in a step of inspecting the tRP specification. However, in the shared sense amplifier as shown in FIG. 2, the two equalizing elements N3 and N4 for the memory cell array 11 and the memory cell array 12 perform equalization. Accordingly, even if one of the equalizing elements has a defect, the other of the equalizing elements performs equalization of the bit lines DT and DB. For this reason, deterioration of the time tRP is reduced, and the deterioration of the time tRP (as shown (F) of FIG. 6) cannot be detected in a step using a low-speed tester that has a limit in terms of a tRP set value.

Then, in the test mode in this example, the signal PDLR for the non-selected side is deactivated (kept at LOW) even during the precharge period, as shown (C) of FIG. 7. An equalizing time can be thereby greatly increased as in the example described before. Accordingly, even with the low-speed tester, defect detection becomes possible.

In the method using the shared sense amplifier, when a normal operation is performed, the signals PDLL and PDLR are independently controlled during an active period. However, during the precharge period, the signals PDLL and PDLR are both activated, and independent control over the signals PDLL and DPLR is not performed (refer to FIG. 6). On contrast therewith, during the precharge period in the test mode of the present invention, the signals PDLL and PDLR are independently controlled as shown (C) of FIG. 7.

Figure 3:
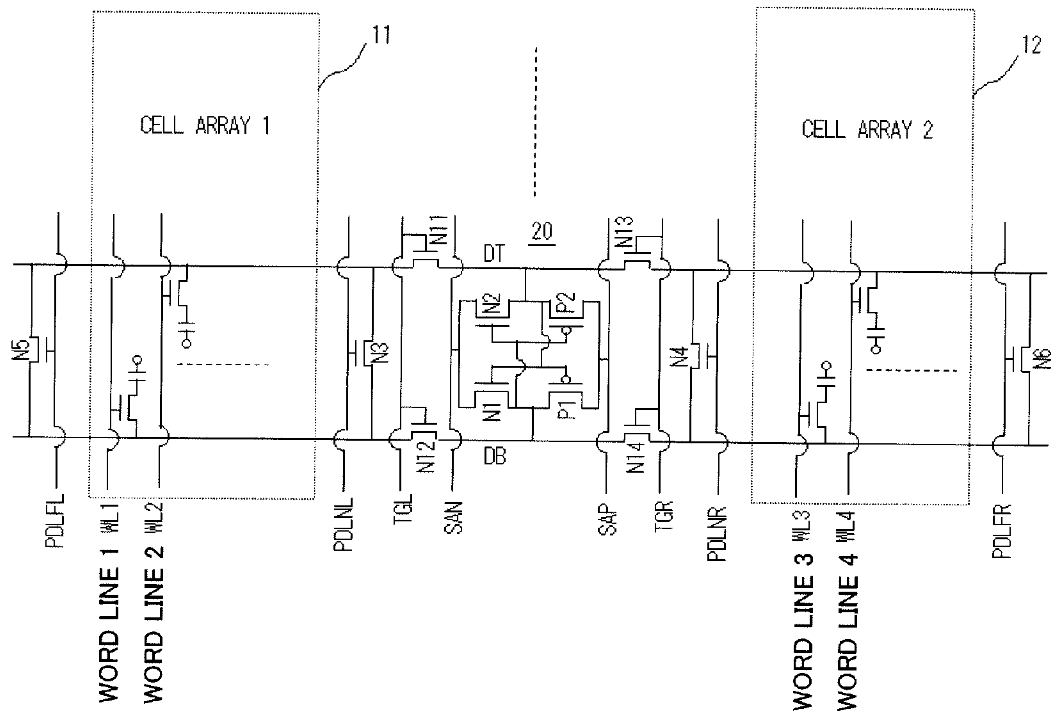
FIG. 3 is a diagram showing a configuration of a third example of the present invention.
Figure 8:
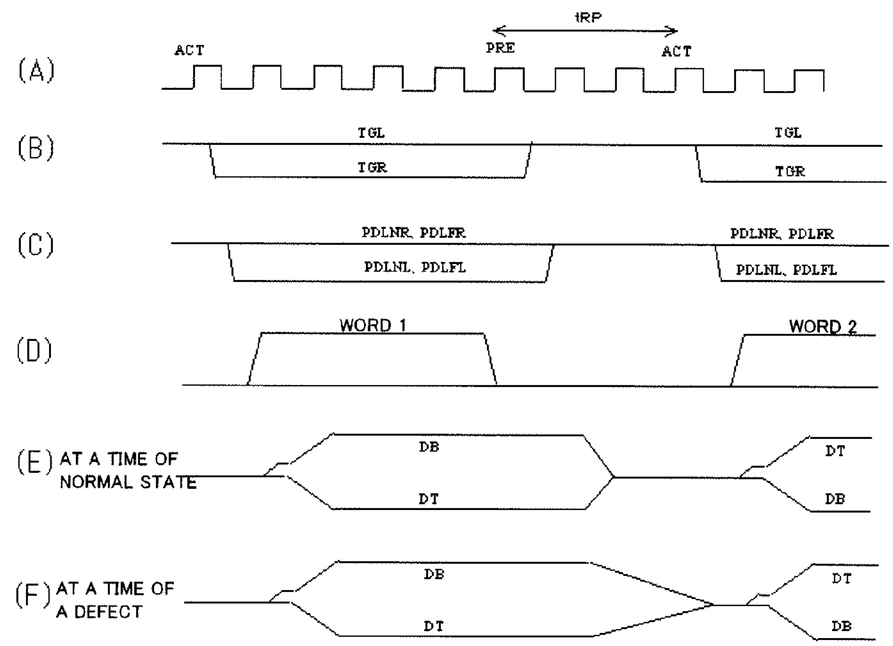
FIG. 8 includes diagrams for explaining an operation in FIG. 3.
Figure 9:
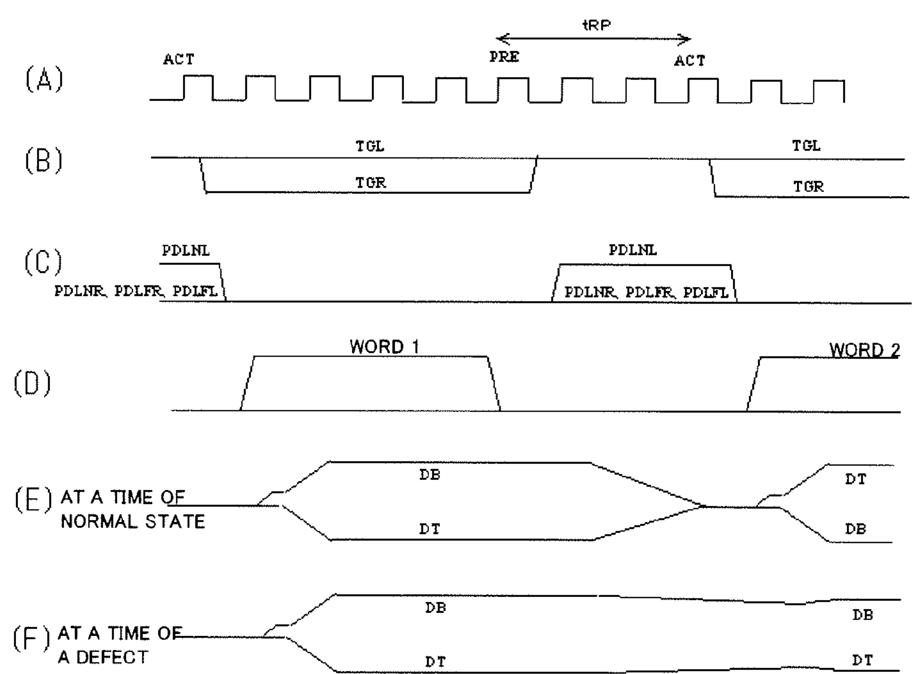
FIG. 9 includes diagrams for explaining a test mode operation in the third example of the present invention.

The present invention can be applied to a shared sense amplifier as shown in FIG. 3 as well, in which a bit line length is long such that equalizing elements are provided on far-end and near-end sides of bit lines. FIG. 3 is a diagram showing a configuration of a third example of the present invention. FIGS. 8 and 9 are timing charts for explaining operations of the third example.

Referring to FIG. 3, the reference character TGL denotes the signal for opening and closing the transfer gates N11 and N12 for the memory cell array 11. The reference character TGR denotes the signal for opening and closing the transfer gates N13 and N14 for the memory cell array 12. Reference characters PDLFL and PDLNL denote signals for turning on and off the equalizing element N3 and an equalizing element N5. Reference character PDLFR and PDLNR denote signals for turning on and off the equalizing element N4 and an equalizing element N6.

FIG. 8 is a diagram for explaining an operation of a circuit in FIG. 3. Referring to FIG. 8, (A) shows a waveform of a clock (and commands), (B) shows waveforms of the signals TGL and TGR, (C) shows waveforms of the signals PDLNL, PDLNR and PDLFL, PDLDR, (D) shows waveforms of the word lines 1 and 2, (E) shows the pair of the bit lines DT and DB at a time of a normal state, and (F) shows waveforms of the pair of the bit lines DT and DB when a defect is generated. In this example too, attention will be focused on a case where command input of the active command (ACT) and the precharge command (PRE) is performed in the order of ACT, PRE, and ACT, with the common synchronous DRAM taken as the example. Before the first ACT is input, the DRAM is in the precharged state. In the precharged state, word lines are all LOW, the signals PDLFL, PDLNL, PDLNR, PDLFR are HIGH, and the signals TGL and TGR are also HIGH. The bit lines DT and DB are in the equalized state. Incidentally, during the precharge period, the power supply to the signals SAP and SAN is stopped to deactivate the sense amplifier 20. The output of the sense amplifier 20 is equalized to the same potential as the bit lines.

Operations of the respective signals when the first ACT command is input will be described. A description will be directed to a case where an external address associated with the word line 1 (word line within the memory cell array (CELL ARRAY 1) on a left side of FIG. 3) is input at the time of the first ACT command.

When the ACT command is received, the signal TGR is switched from HIGH to LOW in order to interrupt a nonselected side of the shared sense amplifier (side where the selected word line is not present). In order to cancel equalization of the bit lines on a selected side of the shared sense amplifier, the signals PDLFL and PDLNL are switched from HIGH to LOW. Then, the selected word line 1 (WL1) is switched from LOW to HIGH, and corresponding memory cell transistors are turned on. A minute difference potential is generated between the pair of the bit lines DT and DB due to electric charge in the memory cell capacitor. Then, the signal SAP is switched to HIGH, and the signal SAN is switched to LOW, thereby activating the sense amplifier 20. Amplification of the minute difference potential between the pair of the bit lines DT and DB by the sense amplifier 20 is then started. When the amplification by the sense amplifier 20 is continued, the bit line DB and DT attain the SAP and SAN levels, respectively.

Next, when the PRE command is received, the selected word line is switched from HIGH to LOW, and the corresponding memory cell transistors are thereby turned off. After the selected word line has been driven LOW, the power supply to the signals SAP and SAN is stopped to deactivate the sense amplifier 20. The signals PDLFL and PDLNL are then switched from LOW to HIGH, and equalization of the bit lines is started. At this point, the signal TGR is also switched from LOW to HIGH almost simultaneously. In this method, a total of four elements function to perform equalization. However, as in the example described above, a non-conductive equalizing element may be present due to some reason caused by a manufacturing process or the like. When such a defect is present, the time tRP is increased in an access to a bit line that uses the defective equalizing element. Thus, the DRAM may not satisfy the tRP specification. Then, though such a defect should be detected in the step of inspecting the tRP specification, the remaining three equalizing elements function to perform equalization. Accordingly, even if one of the equalizing elements has a defect, incomplete equalization is nevertheless performed. Due to that equalization, deterioration of the time tRP is reduced, and the deterioration of the time tRP (as shown (F) of FIG. 8) may not be able to be detected in a step using the low-speed tester that has a limit in terms of the tRP set value, or the like.

Then, in this example, the signals PDLNR and PDLFR on the non-selected side and the signal PDLFL on the selected side are deactivated, even during the precharge period in the test mode, as shown (C) of FIG. 9. Accordingly, when the equalizing element to which the signal PDLNL is connected has a defect, an equalizing time can be greatly increased. Thus, even with the low-speed tester, defect detection becomes possible.

In the example described above, a description was directed to a case where the equalizing element N3 that is turned on and off by the signal PDLNL has the defect. With respect to the other three equalizing elements N4, N5, and N6 as well, by arranging that all the elements can be independently controlled during the precharge period, detection of a defect of each of the connected equalizing elements becomes possible.

The present invention can be utilized for an inspection or a test for a guarantee of the tRP (which is a time from issuing of the precharge command to issuing of the subsequent active command) specification of the DRAM. In tRP specification of today's DRAMs, there is, for example, tRP of 12 ns or less. There is a case wherein a test equipment used in a wafer inspection step has a limit in terms of the tRP set value. Thus, it sometimes happens that the time tRP of 15 ns or less cannot be measured by the test equipment. In such a case wherein a plurality of equalizing elements are present and deterioration of the time tRP reaches in the vicinity of 14 ns, the defect cannot be detected. In the present invention, by separately turning on and off the equalizing elements during the precharge period using a test mode function of the present invention described above, the time tRP can be greatly deteriorated and hence the defect can be detected reliably.

The above description about the present invention was given in connection with the examples described above. The present invention is not limited to the configurations of the above-mentioned examples alone, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:

a plurality of equalizing elements, each connected between a pair of bit lines for equalizing said pair of bit lines; and a control circuit that performs activation/deactivation control of said plurality of equalizing elements, when equalizing said pair of bit lines, wherein when performing a test, control is performed so that activation/deactivation of each of said plurality of equalizing elements is performed separately so that a defective equalizing element may be detected.

2. The semiconductor memory device according to claim 1, wherein said plurality of equalizing elements include first and second equalizing elements disposed on near-end and far-end sides of said pair of bit lines connected to a sense amplifier, respectively;

said first and second equalizing elements separately being subjected to activation/deactivation control thereof during a precharge period.

3. The semiconductor memory device according to claim 2, wherein when performing a test, control is performed so that one of said first and second equalizing elements is activated and the other of said first and second equalizing elements is deactivated.

4. The semiconductor memory device according to claim 1, further comprising:

a sense amplifier shared by first and second memory cell arrays arranged opposed to each other with said sense amplifier interposed therebetween;

a pair of bit lines on a side of said first memory cell array, connected to a pair of bit lines on a side of said sense amplifier via first transfer gates; and a pair of bit lines on a side of said second memory cell array, connected to said pair of bit lines on a side of said sense amplifier via second transfer gates; wherein said plurality of equalizing elements include:

a first equalizing element that equalizes said pair of bit lines on the side of said first memory cell array; and a second equalizing element that equalizes said pair of bit lines on the side of said second memory cell array;

said first and second equalizing elements separately being subjected to activation/deactivation control thereof during a precharge period.

5. The semiconductor memory device according to claim 1, further comprising:

a sense amplifier shared by first and second memory cell arrays arranged opposed to each other with said sense amplifier interposed therebetween;

a pair of bit lines on a side of said first memory cell array, connected to a pair of bit lines of said sense amplifier via first transfer gates; and a pair of bit lines on a side of said second memory cell array connected to said pair of bit lines of said sense amplifier via second transfer gates; wherein said plurality of equalizing elements include:

a first equalizing element that equalizes said pair of bit lines on the side of said first memory cell array extended on a side of said sense amplifier;

a second equalizing element that equalizes said pair of bit lines on the side of said first memory cell array extended on a side opposite to said sense amplifier;

a third equalizing element that equalizes said pair of bit lines on the side of said second memory cell array extended on a side of said sense amplifier; and a fourth equalizing element that equalizes said pair of bit lines on the side of said second memory cell array extended on a side opposite to said sense amplifier;

said first through fourth equalizing elements separately being subjected to activation/deactivation control thereof during a precharge period.

6. The semiconductor memory device according to claim 5, wherein when performing a test, control is performed so that at least one of said first through fourth equalizing elements is activated and the remainder of said first through fourth equalizing elements are deactivated.

7. The semiconductor memory device according to claim 1, wherein each of the equalizing elements comprises a switch element on /off controlled by a control signal supplied to a control terminal thereof, said switch element equalizing said bit line pair when turned on.

8. A method of testing a semiconductor memory device with a plurality of equalizing elements connected between a pair of bit lines, comprising the steps of:

performing activation/deactivation control of said plurality of equalizing elements separately, when equalizing; and detecting a defective equalizing operation.

9. The method according to claim 8, wherein said semiconductor memory device comprises first and second equaling elements disposed on near-end and far-end sides of said pair of bit lines connected to a sense amplifier, respectively; and the activation/deactivation control of said first and second equalizing elements is separately performed during a precharge period.

10. The method according to claim 9, wherein control is performed so that one of said first and second equalizing elements is activated and the other of said first and second equalizing elements is deactivated.

11. The method according to claim 8, wherein a sense amplifier of said semiconductor memory device is shared by first and second memory cell arrays arranged opposed to each other with said sense amplifier interposed therebetween;

a pair of bit lines on a side of said first memory cell array are connected to said pair of bit lines on a side of said sense amplifier via first transfer gates;

a pair of bit lines on a side of said second memory cell array are connected to said pair of bit lines on a side of said sense amplifier via second transfer gates;

said plurality of equalizing elements include:

a first equalizing element that equalizes said pair of bit lines on the side of said first memory cell array; and a second equalizing element that equalizes said pair of bit lines on the side of said second memory cell array; and the activation/deactivation control of said first and second equalizing elements is separately controlled during a precharge period.

12. The method according to claim 8, wherein a sense amplifier is shared by first and second memory cell arrays arranged opposed to each other with said sense amplifier interposed therebetween;

a pair of bit lines on a side of said first memory cell array are connected to said pair of bit lines of said sense amplifier via first transfer gates;

a pair of bit lines on a side of said second memory cell array are connected to said pair of bit lines of said sense amplifier via second transfer gates;

said plurality of equalizing elements include:

a first equalizing element that equalizes said pair of bit lines on the side of said first memory cell array extended on a side of said sense amplifier;

a second equalizing element that equalizes said pair of bit lines on the side of said first memory cell array extended on a side opposite to said sense amplifier;

a third equalizing element that equalizes said pair of bit lines on the side of said second memory cell array extended on a side of said sense amplifier; and a fourth equalizing element that equalizes said pair of bit lines on the side of said second memory cell array extended on a side opposite to said sense amplifier; and the activation/deactivation of said first through fourth equalizing elements is separately controlled during a precharge period.

13. The method according to claim 12, wherein control is performed so that at least one of said first through fourth equalizing elements is activated, and the remainder of said first through fourth equalizing elements are deactivated.

14. The method according to claim 8, wherein the activation/deactivation of said equalizing elements is performed under control of a test equipment, and a time tRP which is a time as from a command for precharging said pair of bit lines to a subsequent active command is tested.

15. A semiconductor memory device comprising:

a plurality of equalizing elements, each connected between a pair of bit lines for equalizing said pair of bit lines;

a control circuit that performs activation/deactivation control of said plurality of equalizing elements separately, when equalizing said pair of bit lines;

a sense amplifier shared by first and second memory cell arrays arranged opposed to each other with said sense amplifier interposed therebetween;

a pair of bit lines on a side of said first memory cell array, connected to a pair of bit lines on a side of said sense amplifier via first transfer gates; and a pair of bit lines on a side of said second memory cell array, connected to said pair of bit lines on a side of said sense amplifier via second transfer gates; wherein said plurality of equalizing elements include:

a first equalizing element that equalizes said pair of bit lines on the side of said first memory cell array; and a second equalizing element that equalizes said pair of bit lines on the side of said second memory cell array;

said first and second equalizing elements separately being subjected to activation/deactivation control thereof during a precharge period.

16. A semiconductor memory device comprising:

a plurality of equalizing elements, each connected between a pair of bit lines for equalizing said pair of bit lines; and a control circuit that performs activation/deactivation control of said plurality of equalizing elements separately, when equalizing said pair of bit lines;

wherein said plurality of equalizing elements include first and second equalizing elements disposed on near-end and far-end sides of said pair of bit lines connected to a sense amplifier, respectively;

said first and second equalizing elements separately being subjected to activation/deactivation control thereof during a precharge period; and wherein when performing a test, control is performed so that one of said first and second equalizing elements is activated and the other of said first and second equalizing elements is deactivated.

17. A semiconductor memory device comprising:

a plurality of equalizing elements, each connected between a pair of bit lines for equalizing said pair of bit lines; and a control circuit that performs activation/deactivation control of said plurality of equalizing elements when equalizing said pair of bit lines, wherein when performing a test, control is performed so that one of said plurality of equalizing elements on said pair of bit lines is activated, others of said plurality of equalizing elements remaining deactivated.

* * * * *